United States Patent
Furui

(10) Patent No.: US 7,790,578 B2
(45) Date of Patent: Sep. 7, 2010

(54) DICING METHOD USING VOLATILE PROTECTIVE AGENT

(75) Inventor: Toshikazu Furui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/848,423

(22) Filed: Aug. 31, 2007

(65) Prior Publication Data
US 2008/0132037 A1 Jun. 5, 2008

(30) Foreign Application Priority Data
Nov. 30, 2006 (JP) .............................. 2006-323006

(51) Int. Cl.
*H01L 21/00* (2006.01)
*H01L 21/78* (2006.01)

(52) U.S. Cl. ................. 438/465; 257/E21.599

(58) Field of Classification Search ................. 438/465; 257/E21.599
See application file for complete search history.

(56) References Cited

U.S. PATENT DOCUMENTS 5,731,229 A 3/1998 Kato et al.
5,983,483 A 11/1999 Tarumizu

FOREIGN PATENT DOCUMENTS

| JP | 55-52236 A | 4/1980 |
| JP | 59-92536 A | 5/1984 |
| JP | 2001-44143 A | 2/2001 |
| JP | 2001-53035 | * 2/2001 |
| JP | 2004-349416 A | 12/2004 |
| WO | WO-2007/081346 | 7/2007 |

OTHER PUBLICATIONS

German Office Action mailed May 19, 2009 for German Application No. 10 2007 040 792.2-33. A partial English-language translation is provided.

* cited by examiner

*Primary Examiner*—Hsien-ming Lee
*Assistant Examiner*—Walter H Swanson
(74) *Attorney, Agent, or Firm*—Fujitsu Patent Center

(57) ABSTRACT

Prior to dicing, a volatile protective agent is applied to at least the face of the substrate in which the devices are fabricated. Then the devices are separated by dicing. After dicing, the surface of the volatile protective agent is cleaned, and then the volatile protective agent is evaporated.

11 Claims, 8 Drawing Sheets

100μm

100μm

DICING METHOD USING VOLATILE PROTECTIVE AGENT

BACKGROUND OF THE INVENTION

1. Field of the Invention

The present invention relates to a manufacturing method for devices to be fabricated on a substrate, and a dicing method. More particularly, the present invention is a manufacturing method including a dicing process in which devices are cut off after the surfaces of the devices are protected with a protective film, and a dicing method.

2. Description of the Related Art

For example, manufacturing processes required for manufacturing multiple devices, which are fabricated on a substrate, for example, semiconductor devices or micro-electromechanical system (MEMS) devices include a dicing process in which the devices are separated. For example, some MEMS devices have a microscopic hole, channel, or a movable part. These devices are fragile due to low mechanical strength and may have flawed surfaces. Consequently, even in the dicing process, the devices may be broken due to vibration from cutting with a dicing saw. Moreover, the faces of the devices may be damaged by fine powder produced during cutting. Therefore, a dicing process has been proposed in which the faces of the devices are protected prior to dicing.

Japanese Unexamined Patent Publication No. 2000-349416 discloses a method in which, for example, after a thermal peel-apart adhesive tape is attached to the face of a semiconductor substrate, in which numerous MEMS devices are fabricated, in order to protect the face of the semiconductor substrate, dicing is performed and after the completion of the dicing, the thermal peel-apart adhesive tape is heated in order to sufficiently reduce adhesive strength, and then peeled off. However, when the face of a substrate is protected with an adhesive tape, if a movable member is fabricated on the face of the substrate, unless the adhesive tape is peeled off uniformly, the movable member may be adversely affected.

Japanese Unexamined Patent Publication No. 10-239346 discloses a method in which: after a semiconductor substrate in which numerous devices each including a movable part and a void are fabricated, is immersed in a resist solution in order to protect the face of the semiconductor substrate, with the resist cured, dicing is performed, and after dicing, the resist on the face of the substrate is removed using a resist peeling agent.

Japanese Unexamined Patent Publication No. 11-160570 discloses a method in which: when dicing is performed in order to dissociate numerous optical couplers which are fabricated on a substrate and each of which includes a dielectric block, a photo-resist is applied in advance to the light incidence surface or light reflecting surface of each dielectric block in order to form a protective film, and after dicing, the protective film is removed using a resist remover.

Problems using a resist as a protective film will be described with reference to FIG. 11 and FIG. 12. FIG. 11 shows a state prior to dicing of a semiconductor substrate placed on a dicing chuck. A semiconductor substrate 51 in which, for example, numerous through holes 52 that are examples of a microscopic structure are formed, has a dicing tape 54 attached to the back thereof, and is thus placed and immobilized on a dicing chuck 55. The face of the semiconductor substrate 51 is covered and protected with a photo-resist 53 of, for example, model AZ-P4210.

In a dicing process, semiconductor substrate 51 is diced together with photo-resist 53 using a dicing saw while water is sprayed on a cutting position. Thereafter, the photo-resist 53 is dissolved with a solvent and thus removed.

FIG. 12 shows a state in which devices are dissociated by grooves 56 formed by performing dicing and photo-resist 53 is removed. Photo-resist 53 covering semiconductor substrate 51 is dissolved by the solvent and removed. However, photo-resist 53 is not removed from part of the microscopic structures into which the solvent is hard to be absorbed. This poses a problem in that a residue 57 of the resist is left. Moreover, the residue of the resist may be left on the back of the semiconductor substrate.

An art in which a resist is not adopted as a protective agent has been unveiled. Japanese Unexamined Patent Publication No. 2001-44143 discloses a method in which: liquefied carbon dioxide is sprayed on a substrate so that dry ice will form on the substrate; in this state, dicing is performed while microparticles of dry ice are sprayed; and after dicing, while a stationary stage is cooled to room temperature, the microparticles of dry ice are further sprayed in order to remove shavings and the dry ice layer. However, when the dry ice is used, a dicing machine and a semiconductor substrate in which devices are fabricated have to be kept at a very low temperature. Moreover, since the semiconductor substrate is alternately brought to room temperature and a very low temperature, the devices may be adversely affected.

Japanese Unexamined Patent Publication No. 59-92356 discloses a method in which a thermally dissoluble polymeric resin, in other words, a resin that is a polymer which is dissolved into monomers when heated is used as a reinforcement resin for the surface of a semiconductor substrate. The reinforcement resin is fully decomposed and removed with heat dissipated during die bonding. However, heating must be used for removal of the thermally dissoluble polymeric resin. Furthermore, Japanese Unexamined Patent Publication No. 59-92356 has not discussed the issue of remaining fine powder produced during cutting.

SUMMARY OF THE INVENTION

The present invention addresses the foregoing problems. An object of the present invention is to provide a device manufacturing method and a dicing method capable of reliably removing fine powder without leaving a protective agent residue, which is used to protect the face of a substrate during dicing, even after removal.

In order to accomplish the above object, a device manufacturing method in accordance with the present invention includes: a device fabrication step of fabricating multiple devices in a substrate; a volatile protective agent application step of applying a volatile protective agent to at least the face of the substrate in which the devices are fabricated; a dicing step of separating the devices from the substrate in which the devices are fabricated; a cleaning step for cleaning the surface of the volatile protective agent after the completion of the dicing step; and a volatile protective agent evaporation step for evaporating the volatile protective agent after the cleaning step.

The volatile protective agent application step is a process for applying a volatile protective agent to both sides of a substrate in which devices are fabricated. The volatile protective agent application step may include a process in which: the volatile protective agent is applied to a dummy substrate; the back of the substrate in which the devices are fabricated is placed on the volatile protective agent; and the volatile protective agent is applied to the face of the substrate in which the devices are fabricated.

Moreover, the volatile protective agent application step may include a step of attaching an adhesive tape to the back of a substrate in which devices are fabricated, and applying a volatile protective agent to the face of the substrate.

Preferably, after the volatile protective agent is applied, the substrate in which the devices are fabricated should be retained at a temperature equal to or lower than the melting point of the volatile protective agent until at least the cleaning step is completed.

At the cleaning step, the surface of a volatile protective agent may be partially removed using a liquid to which high-frequency ultrasonic waves are applied.

The liquid to which high-frequency ultrasonic waves are applied may be cooling water used to cool a dicing chuck which immobilizes the substrate during dicing.

At the cleaning step, the surface of a volatile protective agent may be dissolved using a liquid whose temperature is higher than the melting point of the volatile protective agent.

At the volatile protective agent evaporation step, a substrate covered with a volatile protective agent is evaporated in an atmospheric pressure environment or at room temperature.

At the volatile protective agent evaporation step, a substrate covered with a volatile protective agent is evaporated in a depressurized atmosphere.

A dicing method in accordance with the present invention is a dicing method for substrates including: a step of placing a substrate on a base; a step of applying a volatile protective agent to the face of the substrate; a step of solidifying the volatile protective agent; a step of dicing the substrate together with the volatile protective agent; a step of cleaning the surface of the volatile protective agent; and a step of dissolving or vaporizing the volatile protective agent.

According to a device manufacturing method and a dicing method in which the present invention is implemented, the face of a substrate can be prevented from being damaged. Moreover, fine powder or dust stemming from a dicing step will not adhere to the substrate. Furthermore, a volatile protective agent is evaporated and thus removed while being left intact. Therefore, unlike a method in which a resist protective agent is employed, a residue of the protective agent is not left. Consequently, production of a defective device can be prevented, and a product yield can be improved.

DESCRIPTION OF THE PREFERRED EMBODIMENTS

Figure 1:
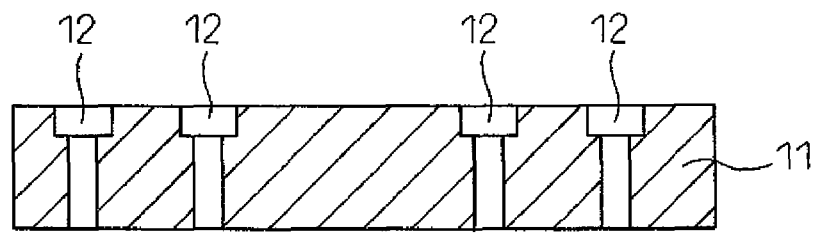
FIG. 1 shows an example of a substrate in which devices each having a microscopic structure are fabricated.

FIG. 1 is a schematic explanatory diagram showing devices employed in an embodiment. As shown in FIG. 1, the devices employed in the present embodiment are bio-MEMS devices having through holes 12 formed in a silicon substrate 11. Aside from the bio-MEMS devices, the devices can be any type of device capable of being fabricated in a substrate, for example, semiconductor circuits, sensors, or optical elements. Moreover, the substrate is not limited to a semiconductor substrate, but may be a substrate made of quartz for example. The substrate can be any type of substrate that numerous devices can be fabricated therein.

A process of covering both sides of a substrate, in which numerous devices are fabricated, with a volatile protective agent will be described below. In the present embodiment, a dummy substrate is used to support a substrate.

Figure 2:
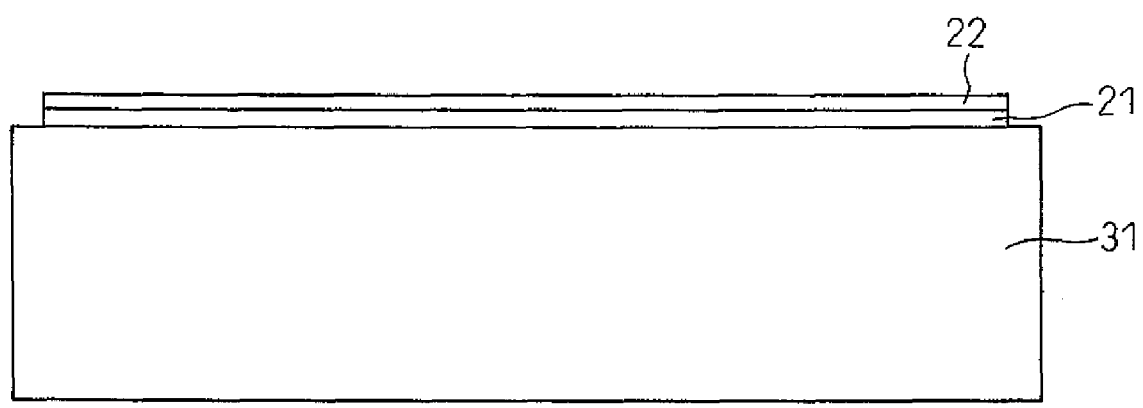
FIG. 2 shows a state in which a volatile protective agent is applied to a dummy substrate.

FIG. 2 shows a dummy substrate plated on a dicing chuck. A dicing chuck 31 is made of, for example, a porous ceramic substance and connected to a vacuum pump (not shown). Dicing chuck 31 holds and immobilizes a dummy substrate 21 by utilizing negative pressure. Furthermore, the dicing chuck 31 is cooled by a cooling pipe (not shown) in which a coolant circulates, and dicing chuck 31 is retained at a predetermined temperature.

A volatile protective agent 22 is applied to dummy substrate 21. A method of applying the volatile protective agent is not limited to any specific one. A known application method employing a dispenser may be adopted. Volatile protective agent 22 protects the back of a substrate 11 (see FIG. 1) that is placed on the dicing chuck 31 to be diced, and fixes substrate 11 to dummy substrate 21. The volatile protective agent employed in the present embodiment is octamethylcyclotetrasiloxane ($C_8H_{24}O_4Si_4$, melting point: 18° C.). Moreover, hexamethylcyclotrisiloxane ($C_6H_{18}O_3Si_3$, melting point: 65° C.) is also usable as the volatile protective agent. Any other volatile protective agent may be adopted.

Figure 3:
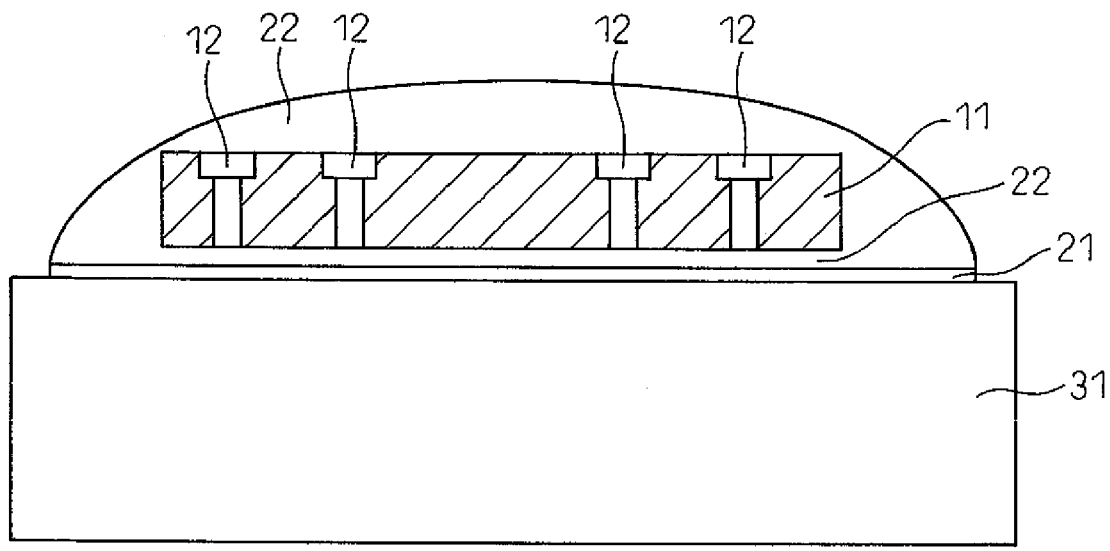
FIG. 3 shows a state in which the volatile protective agent is applied to the face of the substrate in which the devices are formed and which is placed on the dummy substrate.

Substrate 11 is placed on volatile protective agent 22 applied to dummy substrate 21 shown in FIG. 2. Since octamethylcyclotetrasiloxane is adopted as volatile protective agent 22, substrate 11, or dicing chuck 31, is retained at a temperature equal to or higher than the melting point of octamethylcyclotetrasiloxane (18° C.) to avoid solidification thereof. After substrate 11 is placed, octamethylcyclotetrasiloxane adopted as volatile protective agent 22 is applied to the face of substrate 11. The thickness of the applied protective agent to the face of the substrate is set to a value preventing substrate 11 from being exposed until at least a process in which volatile protective agent 22 is removed. Thereafter, the temperature of the dicing chuck is lowered to be equal to or lower than the melting point of volatile protective agent 22, whereby volatile protective agent 22 is solidified. As a result, substrate 11 is entirely covered and protected with volatile protective agent 22. Moreover, substrate 11 is attached and fixed to dummy substrate 21. FIG. 3 shows a state in which substrate 11 is placed on volatile protective agent 22 applied to dummy substrate 21, and volatile protective agent 22 is applied to the face of substrate 11.

When substrate 11 is covered with the protective agent, substrate 11 is ready for dicing. According to a known method, substrate 11 is diced using a dicing saw while cutting water or cooling water is sprayed on the cutting point.

Figure 4:
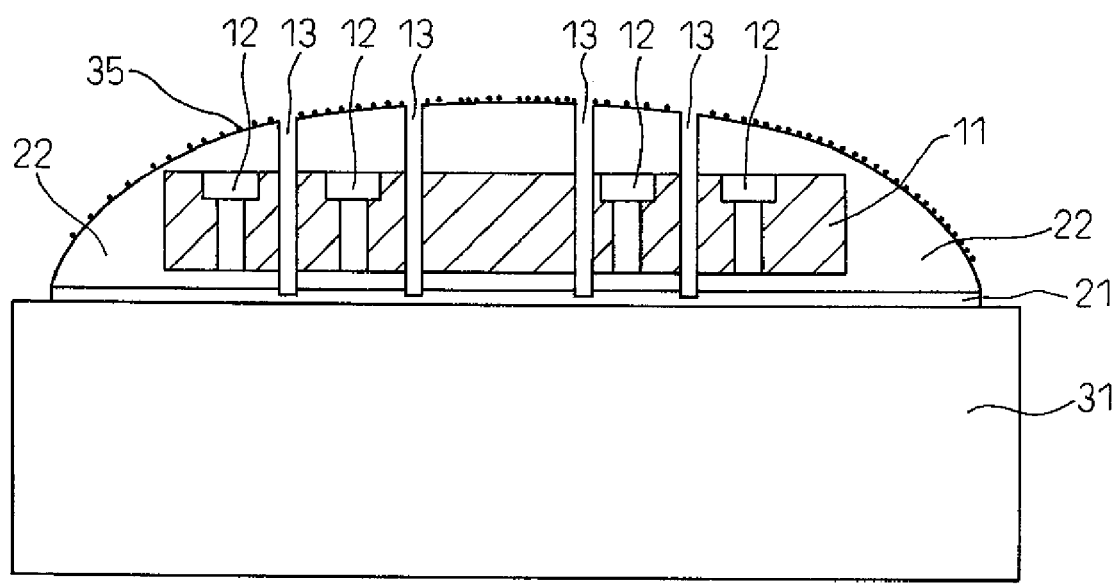
FIG. 4 shows a state in which the substrate covered with the volatile protective agent is diced.

FIG. 4 shows a state attained after substrate 11 is diced. Dicing grooves 13 are formed in the substrate 11 in a lattice pattern. Incidentally, dicing may not fully separate substrate 11 into pieces, but may cut half-way through the substrate with the lower part of the substrate left uncut. Fine powder 35 or any other debris stemming from dicing adhere to or remain on the surface of volatile protective agent 22. If volatile protective agent 22 were evaporated as it is, fine powder 35 would adhere to substrate 11. Therefore, treatment is performed to remove fine powder 35.

Figure 5:
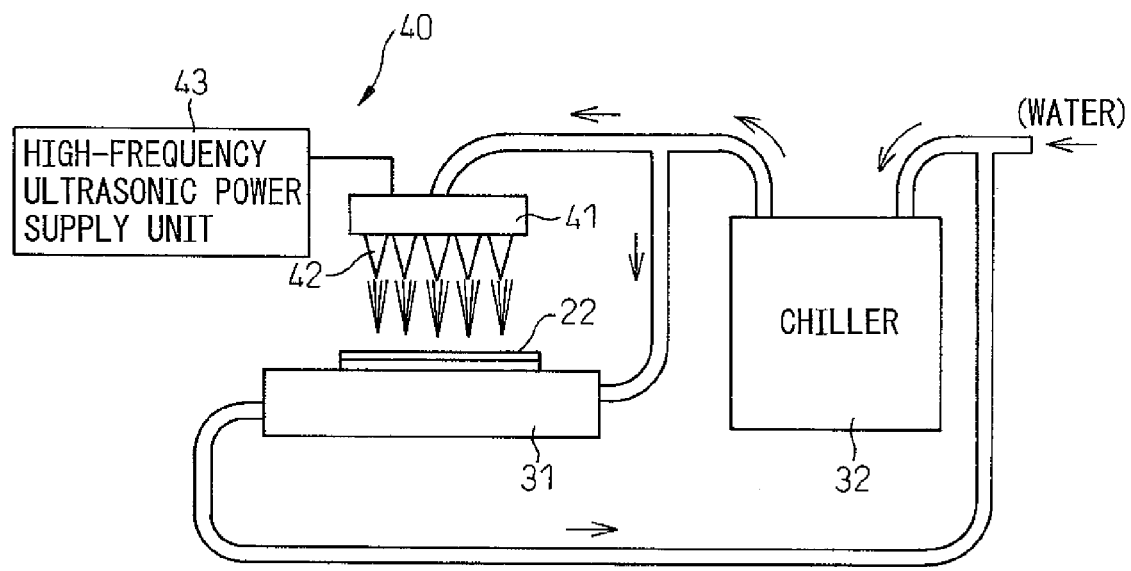
FIG. 5 is an explanatory diagram concerning high-frequency ultrasonic cleaning that succeeds dicing.

FIG. 5 is an explanatory diagram concerning high-frequency ultrasonic cleaning adopted in order to remove fine powder from the volatile protective agent. As seen from FIG. 5, high-frequency ultrasonic cleaning equipment 40 is used to spray a cleaning liquid to diced volatile protective agent 22. Thus, the surface of volatile protective agent 22 is ground in order to eliminate fine powder or dust. High-frequency cleaning equipment 40 includes a jet nozzle unit 41 having multiple jet nozzles 42 lined, and a high-frequency ultrasonic power supply unit 43 that supplies power to jet nozzle unit 41 so as to provide a cleaning solution, for example, water which is jetted out of the jet nozzles by high-frequency ultrasonic waves. When high-frequency ultrasonic waves are applied to water to be jetted out of jet nozzles 42, numerous small bubbles are generated. When the bubbles violently burst, they clean a surface with which they are in contact. As an oscillatory frequency for ultrasonic waves is raised, the number of generated bubbles increases and the energy of each bubble decreases. Consequently, microparticles can be removed without any damage to an object.

Figure 6:
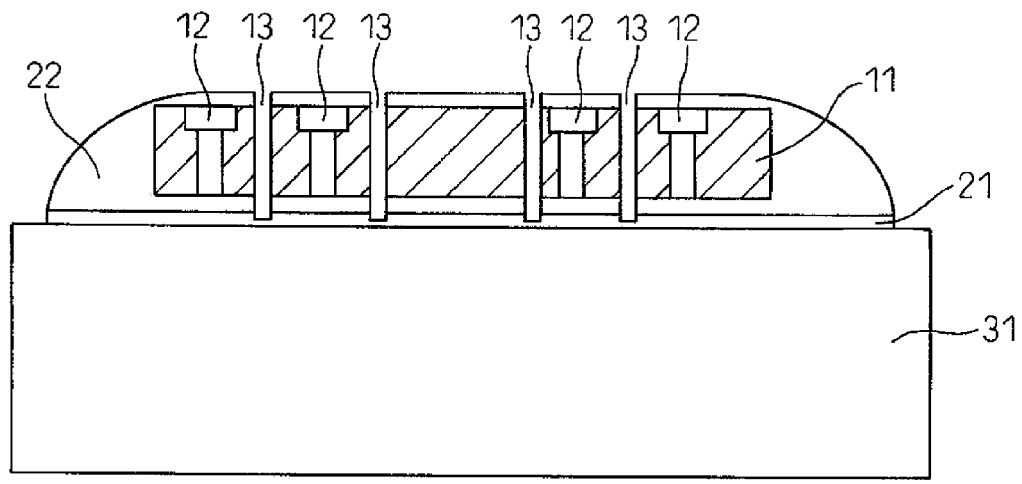
FIG. 6 shows a state in which powdery shavings are removed from the surface of the volatile protective agent using high-frequency ultrasonic waves.

The jet nozzle unit 41 has multiple nozzles 42 lined. Once jet nozzle unit 41 is moved in a direction orthogonal to the line of nozzles 42, the entire surface of the volatile protective agent 22 can be cleaned. Only one jet nozzle may be used and swept lengthwise and sideways. As water to be jetted out of jet nozzles 42, cooling water supplied from a chiller 32 and used to cool the chuck 31 that holds a substrate is used. As shown in FIG. 5, the cooling water to be used to cool dicing chuck 31 is supplied from chiller 32 and returned to chiller 32. Since the melting point of octamethylcyclotetrasiloxane that is used to protect the substrate is 18° C., cooling water is supplied in order to keep chuck 31 at about 5° C. When cooling water is used, the protective agent will not be dissolved, but the surface of the protective agent can be shaved and fine powder adhering to the surface can be removed. Consequently, the thickness of the surface of a protective agent shaved with water jets can be controlled by adjusting an amount of water and time to be jetted out of jet nozzles 42. FIG. 6 shows a state in which fine powder is removed by performing high-frequency ultrasonic cleaning. As shown in FIG. 6, the surface of volatile protective agent 22 is shaved and fine powder left on the surface of volatile protective agent 22 is removed.

If volatile protective agent 22 can be thickly applied, after dicing, water whose temperature exceeds the melting point of the volatile protective agent 22 may be flowed in order to dissolve the surface of volatile protective agent 22. Thus, fine powder remaining on the surface may be removed.

Thereafter, cooling of the dicing chuck 31 by the chiller 32 is stopped, and the substrate covered with volatile protective agent 22 is left intact at ambient temperature. Since the vapor pressure of octamethylcyclotetrasiloxane that is volatile protective agent 22 is high, the volatile protective agent evaporates. This results in devices whose surfaces are not damaged, in which fine powder is not mixed, and on which no residue is left. In order to facilitate evaporation of volatile protective agent 22, the substrate covered with volatile protective agent 22 should be disposed in a depressurized environment in order to speed up evaporation. When hexamethylcyclotrisiloxane whose melting point is 65° C. is used, the vapor pressure thereof is so high that hexamethylcyclotrisiloxane is evaporated under atmospheric pressure in a room-temperature environment. Even in this case, when hexamethylcyclotrisiloxane is disposed in the depressurized environment, it is evaporated more quickly. However, for quicker evaporation, the volatile protective agent may be heated.

In the present embodiment, substrate 11 in which devices are fabricated is covered with volatile protective agent 22, and fine powder on the volatile protective agent is removed. Therefore, the possibility that devices fabricated in substrate 11 may be broken during removal of the fine powder or the like can be minimized.

Figure 7:
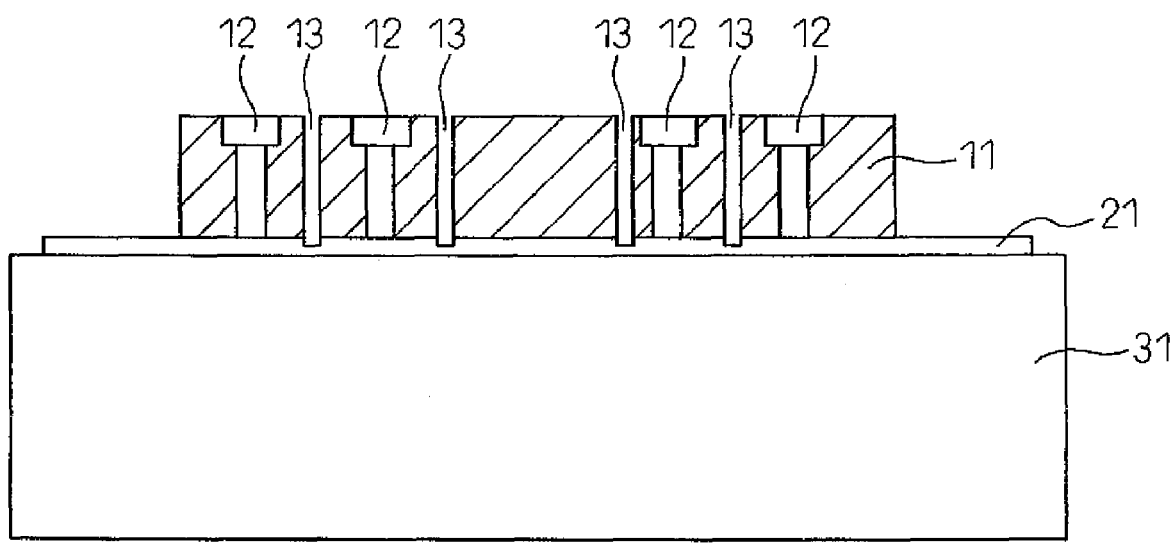
FIG. 7 shows a state in which the volatile protective agent is evaporated.

In the present embodiment, volatile protective agent 22 is used to bond substrate 11 to dummy substrate 21. Therefore, when volatile protective agent 22 is evaporated, substrate 11 is isolated from dummy substrate 21. FIG. 7 shows a state in which the volatile protective agent is evaporated. As shown in FIG. 7, not only the volatile protective agent covering the face of substrate 11, but also the volatile protective agent covering the back thereof has evaporated. Consequently, substrate 11 is not bonded to dummy substrate 21. The substrate 11 can therefore be readily detached from the dummy substrate 21.

According to a manufacturing method in which the present embodiment is implemented, the face of a substrate can be prevented from being damaged at a dicing step or a step of removing fine powder. Moreover, fine powder or dust stemming from the dicing step does not adhere to the substrate. Furthermore, a volatile protective agent is evaporated and removed at ambient temperature. Compared with a method that adopts a resist as a protective agent, a residue of the protective agent will not be left in concave parts of a substrate or of micro-fabricated devices. Consequently, generation of a defective device can be prevented and product yield can be improved.

Furthermore, when a resist is adopted as a protective agent, a solvent is needed to remove the protective agent. In the present embodiment, while a volatile protective agent is left intact at ambient temperature, it is removed. The cost for use of the solvent can be saved. Moreover, since it is not necessary to attach a dicing tape to the back of a substrate, the step of peeling off the tape is omitted. Furthermore, devices being damaged or adversely affected by peeling off the tape will not occur.

The method of the present embodiment in which a volatile protective agent is applied to the face of a dummy substrate, a substrate in which devices are fabricated is fixed to the dummy substrate, and the protective agent is applied to the face of the substrate would prove effective especially in a case where the back of the substrate is prone to break. However, if the back of the substrate is strong, and after the substrate is diced with an adhesive tape attached to the back thereof, when the adhesive tape is peeled off, the devices will not be adversely affected. In this case, the adhesive tape may be used to secure the back of the substrate, and the volatile protective agent may be applied to only the face of the substrate.

Figure 8:
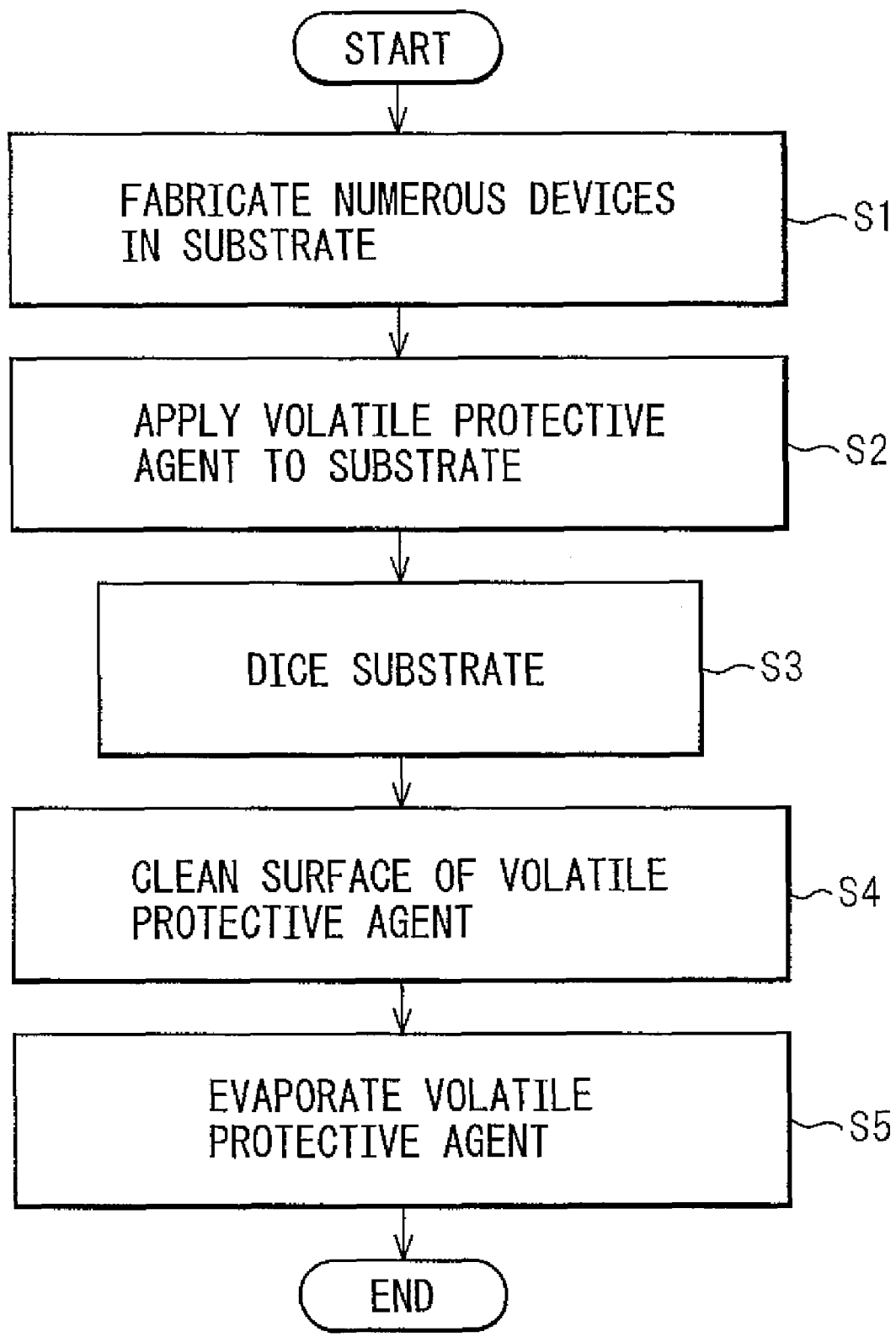
FIG. 8 describes an action flow employed in an embodiment.
Figure 9:
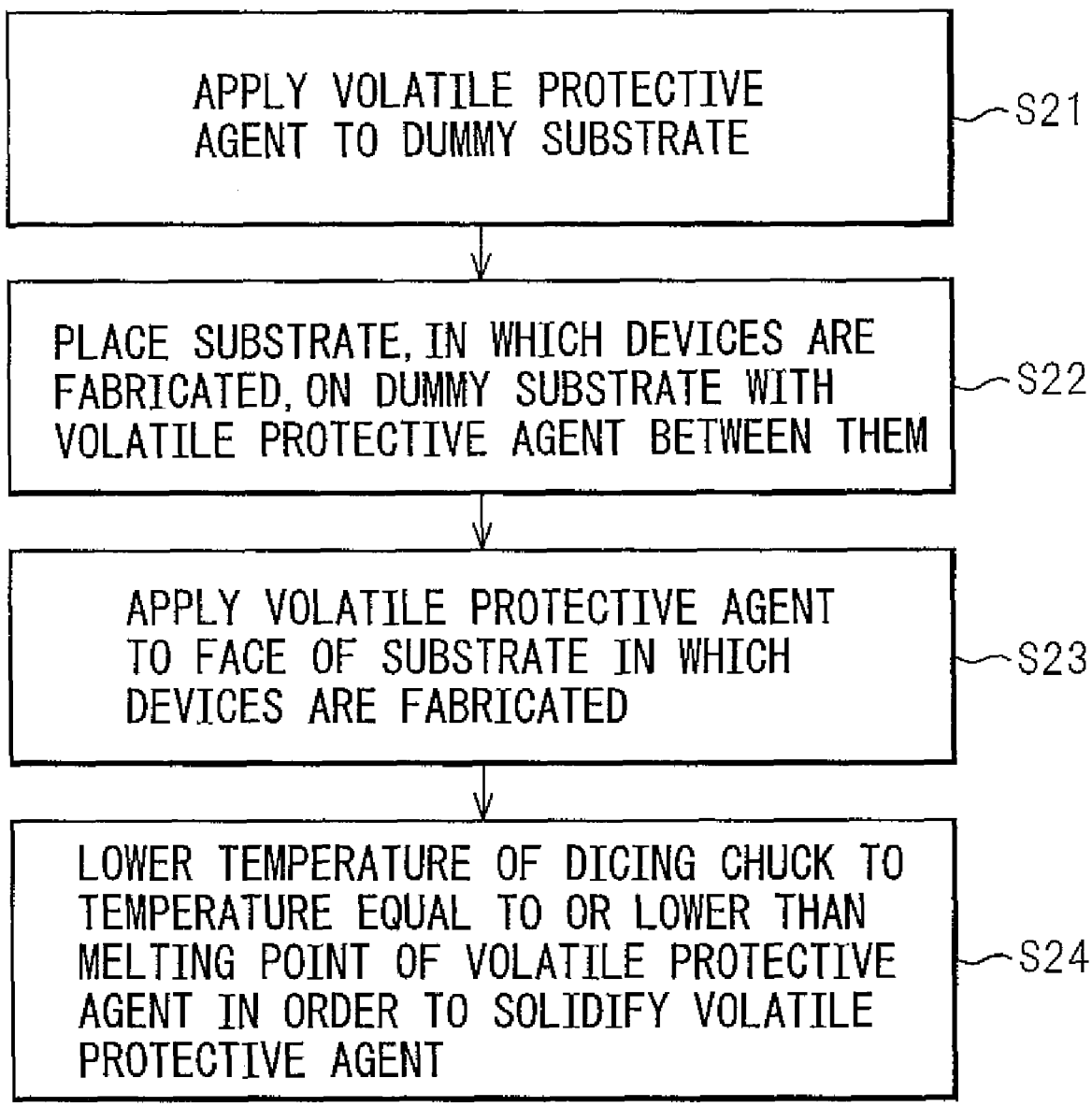
FIG. 9 concretely describes a volatile protective agent application step included in the action flow employed in the embodiment.

FIG. 8 and FIG. 9 describe a flow of actions to be performed in the present embodiment of the present invention.

At step S1, devices are fabricated in substrate 11 made of, for example, a semiconductor (see FIG. 1).

At step S2, a volatile protective agent is applied to substrate 11. FIG. 9 describes a concrete process for applying the volatile protective agent.

At step S21 in FIG. 9, volatile protective agent 22 is applied to dummy substrate 21 placed on dicing chuck 31 (see FIG.

2). Employed volatile protective agent 22 is octamethylcyclotetrasiloxane ($C_8H_{24}O_4Si_4$, melting point: 18° C.).

At step S22, substrate 11 is placed on dummy substrate 21. At step S23, volatile protective agent 22 is applied to the face of substrate 11.

At step S24, the temperature of the dicing chuck is lowered to be equal to or lower than the melting point of the volatile protective agent, whereby volatile protective agent 22 is solidified. Substrate 11 is covered entirely by the protective agent and fixed to dummy substrate 21 (see FIG. 3).

At step S3, according to a known method, dicing is performed using a dicing saw while cutting water or cooling water is being sprayed on the cutting point. As a result, fine powder 35 adheres to the surface of volatile protective agent 22 and remains (see FIG. 4). If volatile protective agent 22 is evaporated, fine powder 35 may adhere to substrate 11.

At step S4, the surface of volatile protective agent 22 is therefore cleaned by utilizing high-frequency ultrasonic cleaning. Specifically, cleaning water to which ultrasonic waves are applied is sprayed, whereby the surface of volatile protective agent 22 is shaved in order to remove the fine powder or dust (see FIG. 6). If volatile protective agent 22 is thickly applied at step S2, the surface of protective agent 22 can be dissolved by spraying room temperature water or hot water to eliminate fine powder 35 with the dissolved protective agent.

At step S5, cooling the dicing chuck is stopped and left intact at room temperature in order to evaporate volatile protective agent 22. This results in devices whose surfaces are not damaged, into which fine powder is not mixed, and in which no residue is left (see FIG. 7). Herein, since volatile protective agent 22 is used to attach substrate 11 to dummy substrate 21, substrate 11 is isolated from the dummy substrate.

An example of the present invention will be described. Microscopic holes of about 3 µm in diameter are formed in a silicon wafer of about 500 µm thick in order to fabricate bio-MEMS devices. Octamethylcyclotetrasiloxane is uniformly applied as a volatile protective agent so that it will have a thickness of 200 µm. Then, the silicon wafer is cooled in order to solidify the protective agent.

The silicon wafer is diced using a dicing saw. A purified water jet (1.2 l/min) of 0° C. to which high-frequency ultrasonic waves (1 MHz, 60 W) are applied is used to remove only the superficial layer of the protective agent, whereby the fine powder of silicon is removed. Then, the protective agent is evaporated. This results in bio-MEMS devices that have no dust stuck to the surfaces or the perimeters of the microscopic holes and have no residue of the protective agent on the surfaces or the perimeters of the microscopic holes thereof.

Figure 10A:
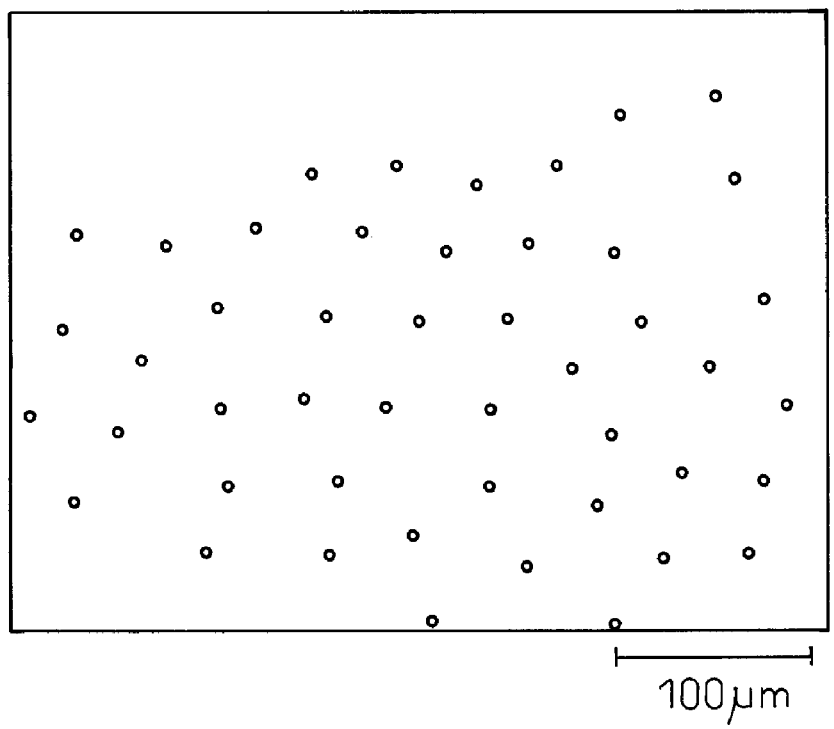
FIG. 10a is an enlarged top view of devices having microscopic holes and being manufactured according to the manufacturing method of the embodiment.
Figure 10B:
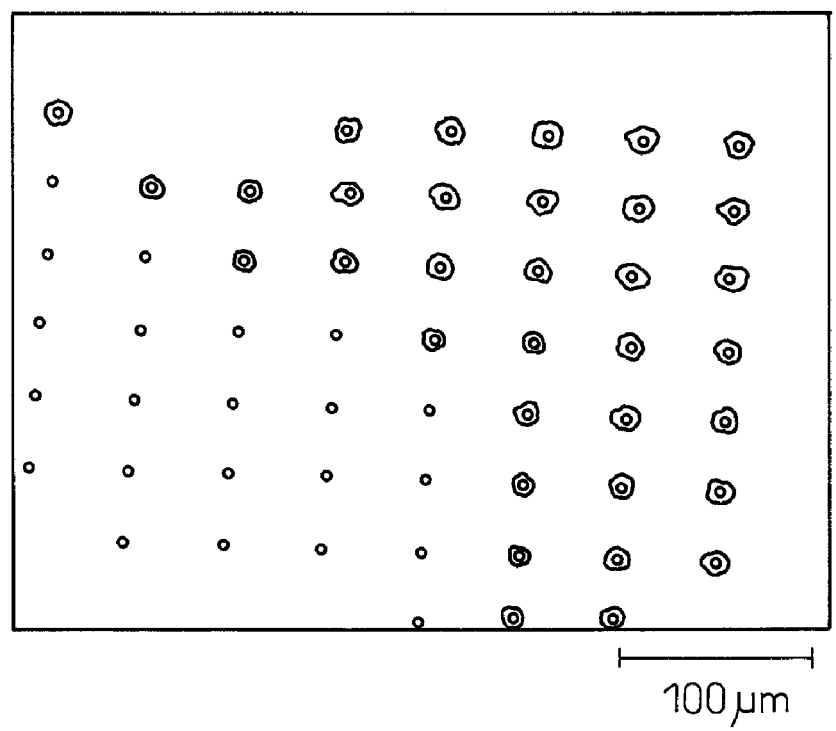
FIG. 10b is an enlarged top view of devices having microscopic holes and being manufactured according to a conventional manufacturing method.
Figure 11:
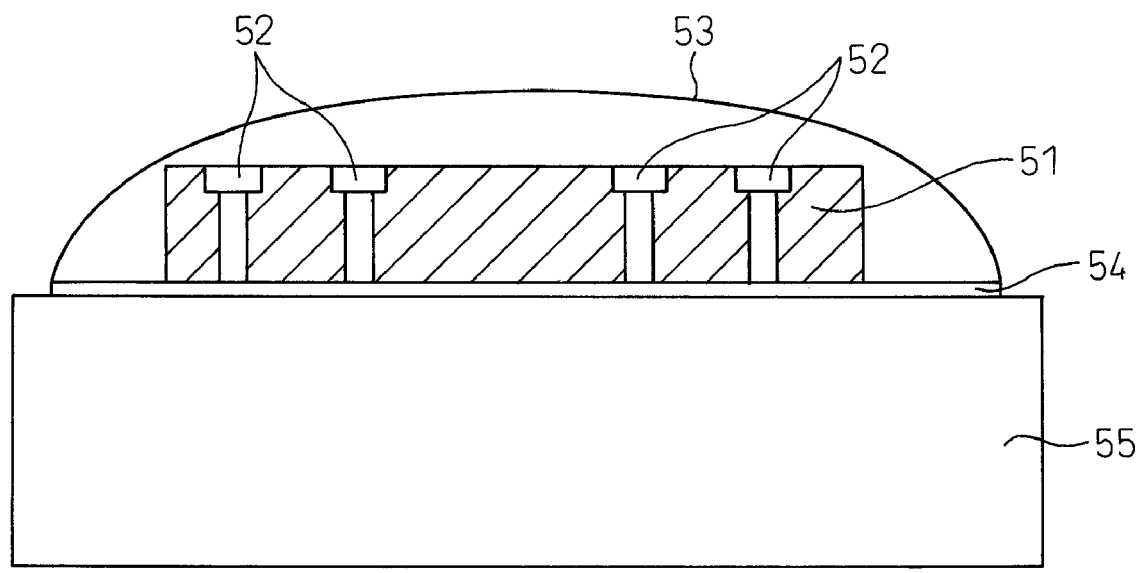
FIG. 11 shows a state in which a substrate is protected with a protective agent, which is realized with a resist, according to a conventional manufacturing method.
Figure 12:
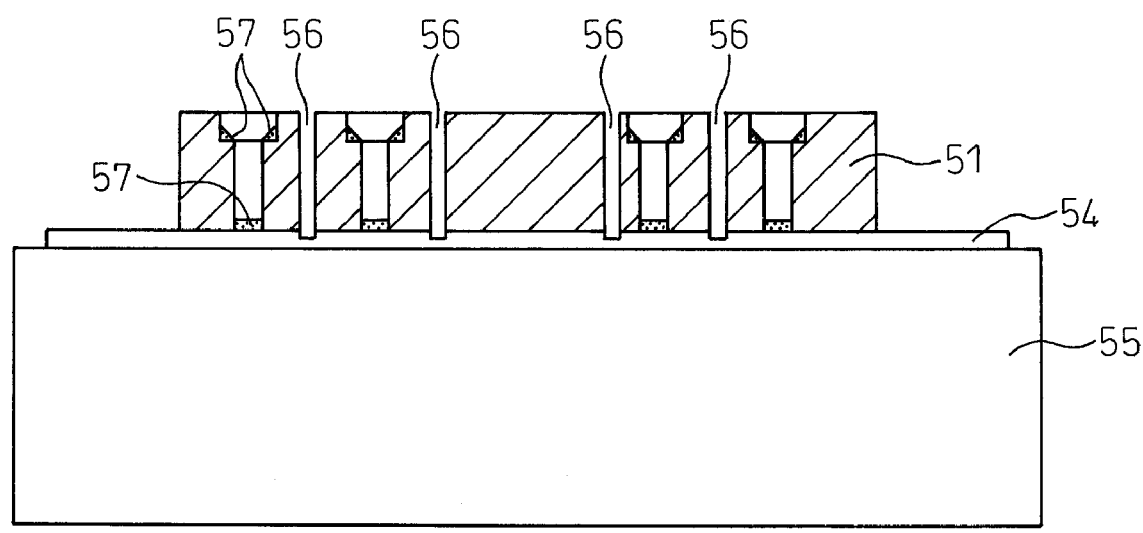
FIG. 12 shows a state in which the protective agent realized with a resist has been removed according to the conventional manufacturing method.

FIG. 10(b) shows a comparative example in which a conventional resist (model AZ-P4210) is applied to a silicon wafer in which bio-MEMS devices having microscopic holes are fabricated. The resist is removed using an organic solvent after dicing. In the comparative example, as shown in FIG. 10(b), a residue of the resist is observed in the perimeters of the microscopic holes. Since the residue of the resist is water-repellent, the residue of the resist on the perimeters of the microscopic holes serving as water paths adversely affects the performance of the bio-MEMS devices.

What is claimed is:

1. A device manufacturing method comprising:
    fabricating a plurality of devices in a substrate;
    applying a volatile protective agent to at least the face of the substrate;
    dicing the devices from the substrate while water is sprayed on a dicing point;
    shaving a surface of the volatile protective agent by using a liquid to which high-frequency ultrasonic waves are convoluted; and
    evaporating the volatile protective agent by leaving the volatile protective agent at room temperature after the shaving.

2. The device manufacturing method according to claim 1, wherein applying the volatile protective agent to the substrate includes:
    applying the volatile protective agent to a dummy substrate;
    placing the back of the substrate on the dummy substrate; and
    applying the volatile protective agent to the face of the substrate.

3. The device manufacturing method according to claim 1, wherein applying the volatile protective agent to the substrate includes:
    attaching an adhesive tape to the back of the substrate; and
    applying the volatile protective agent to the face of the substrate.

4. The device manufacturing method according to claim 1, wherein after the volatile protective agent is applied, the substrate is retained at a temperature equal to or lower than the melting point of the volatile protective agent until at least the shaving of the substrate is completed.

5. The device manufacturing method according to claim 1, wherein the liquid to which high-frequency ultrasonic waves are applied is cooling water to be used to cool a dicing chuck that immobilizes the substrate during dicing.

6. The device manufacturing method according to claim 1, wherein when evaporating the volatile protective agent, the volatile protective agent covering the substrate is evaporated at atmospheric pressure and room temperature.

7. The device manufacturing method according to claim 1, wherein when evaporating the volatile protective agent, the volatile protective agent covering the substrate is evaporated in a depressurized atmosphere.

8. The device manufacturing method according to claim 1, wherein applying the volatile protective agent to the substrate includes:
    applying the volatile protective agent to a base on which the substrate is to be placed;
    placing the substrate on a base to which the volatile protective agent has been applied; and
    applying the volatile protective agent to the face of the substrate placed on the base.

9. The device manufacturing method according to claim 8, wherein:
    the volatile protective agent has a melting point;
    the application of the volatile protective agent to the base is performed at a temperature equal to or higher than the melting point; and
    the volatile protective agent is set to the temperature equal to or lower than the melting point after the substrate is placed on the base.

10. The device manufacturing method according to claim 9, wherein the melting point of the volatile protective agent corresponds to room temperature.

11. The device manufacturing method according to claim 1, wherein shaving the surface of the volatile protective agent removes debris from the surface of the volatile protective agent resulting from the dicing.

* * * * *